US011454665B2

(12) United States Patent
Bush et al.

(10) Patent No.: US 11,454,665 B2
(45) Date of Patent: Sep. 27, 2022

(54) INTEGRATED CIRCUIT SPIKE CHECK TEST POINT IDENTIFICATION APPARATUS AND METHOD

(71) Applicant: Texas Instruments Incorporated, Dallas, TX (US)

(72) Inventors: William Joshua Bush, Sunnyvale, CA (US); Neeraj Bhardwaj, Bangalore (IN); Erfan Shirazian, Fort Worth, TX (US); Madhusudan Sampath, Bangalore (IN); Pavinkumar Ramasamy, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 214 days.

(21) Appl. No.: 16/523,758

(22) Filed: Jul. 26, 2019

(65) Prior Publication Data
US 2020/0033397 A1    Jan. 30, 2020

Related U.S. Application Data

(60) Provisional application No. 62/703,707, filed on Jul. 26, 2018.

(51) Int. Cl.
G01R 31/28 (2006.01)
G01R 1/067 (2006.01)
G01R 1/073 (2006.01)

(52) U.S. Cl.
CPC ....... G01R 31/287 (2013.01); G01R 1/06705 (2013.01); G01R 1/07364 (2013.01); G01R 31/2886 (2013.01); G01R 31/2887 (2013.01); G01R 31/2893 (2013.01)

(58) Field of Classification Search
CPC ....... G01R 1/00; H01L 21/00; H01L 2221/00; G06T 1/00; G06T 2200/00
See application file for complete search history.

(56) References Cited

U.S. PATENT DOCUMENTS

| 6,407,687 | B2* | 6/2002 | Martin | G11C 27/024 341/122 |
| 6,483,448 | B2* | 11/2002 | Martin | H03M 1/1009 341/122 |
| 2012/0239339 | A1* | 9/2012 | Kaneko | G01R 31/3025 702/122 |

(Continued)

Primary Examiner — Jermele M Hollington
Assistant Examiner — Temilade S Rhodes-Vivour
(74) Attorney, Agent, or Firm — Ronald O. Neerings; Charles A. Brill; Frank D. Cimino

(57) ABSTRACT

A nontransitory computer-readable program storage medium storing program instructions. The program, when executed by a processor, has the processor capable of receiving a set of input data, the input data relating to devices on a test board for testing a device under test. The program, when executed by a processor, also is capable of transforming the set of input data into test board mapping data. The test board mapping data comprises an ordered listing of potential test points along a path that couples to a conductive surface, wherein the potential test points are derived from at least one of the test board attributes. Further, the program, when executed by a processor, is capable of identifying a selected test point from among the one or more potential test points, the selected test point for spike check probing of the device under test.

25 Claims, 10 Drawing Sheets

(56) References Cited

U.S. PATENT DOCUMENTS

2014/0226003 A1* 8/2014 Phaneuf .............. H01J 37/3005
   348/80
2018/0059169 A1* 3/2018 Howard ............. G01R 31/2815
2018/0180668 A1* 6/2018 Ong ................... G01R 31/2889

* cited by examiner

800

[ 'PAD' NONE NONE ]
[ 'RLY_TH' 'RLY_CBIT' NONE ]
[ 'RLY_TH' 'C2' GND1 ]
[ 'C1' 'GND1' NONE ]
[ 'R_TH' 'GND1' NONE ]
[ 'R_SMT' 'GND1' NONE ]

900

[ 0 NONE NONE ]
[ 1 9 NONE ]
[ 1 9 8 ]
[ 9 8 NONE ]
[ 1 8 NONE ]
[ 9 8 NONE ]

1000

| DEVICE/TYPE | WEIGHT |
|---|---|
| PAD | 0 |
| THROUGH HOLE DEVICE | 1 |
| RESERVED | 2-6 |
| SMT RELAY | 7 |
| GROUND | 8 |
| DON'T CARE (e.g., OTHER SMT DEVICES; RELAY CBIT) | 9 |

← DEVICE INFORMATION (header)
WEIGHT ↓

1200

```
[ [ 'PIN 2 _path' 'PIN 2 _path' 'PIN 2 _path' 'PIN 2 _path' 'PIN 2 _path' ]
['C1_1' 'DGND1' None None None None ]
['C3_1' 'DGND1' None None None None ]
['C4_1' 'DGND1' None None None None ]
['K38_1' 'UNNAMED_17_G3VM41GR8_I145_1' None None None None ]
['K38_1' 'CBIT25' None None None None ]
['K38_1' 'UNNAMED_16_CAPNONPOLARIZED_I216_2' 'C2_1' 'DGND1' None None ]
['K38_1' 'UNNAMED_16_CAPNONPOLARIZED_I216_2' 'K39_1' 'UNNAMED_17_G3VM41GR8_I146_1' None None ]
['K38_1' 'UNNAMED_16_CAPNONPOLARIZED_I216_2' 'K39_1' 'CBIT37' None None ]
['K38_1' 'UNNAMED_16_CAPNONPOLARIZED_I216_2' 'K39_1' 'UNNAMED_16_G3VM41GR8_I215_3' 'R17_1' 'DGND1' ]
['K3_1' 'UNNAMED_17_G3VM41GR8_I23_1' None None None None ]
['K3_1' 'CBIT2' None None None None ]
['K3_1' 'UNNAMED_16_G3VM41GR8_I121_3' 'C17_1' None None None ]
['K3_1' 'UNNAMED_16_G3VM41GR8_I121_3' 'C18_1' None None None ]
['K3_1' 'UNNAMED_16_G3VM41GR8_I121_3' 'K1_1' None None None ]
['K3_1' 'UNNAMED_16_G3VM41GR8_I121_3' 'K2_1' None None None ]
['K3_1' 'UNNAMED_16_G3VM41GR8_I121_3' 'SITE1' None None None ]
['K3_1' 'UNNAMED_16_G3VM41GR8_I121_3' 'VCC_1' None None None ]
['K4_1' 'UNNAMED_17_G3VM41GR8_I25_1' None None None None ]
['K4_1' 'CBIT3' None None None None ]
['K4_1' 'IO25' 'P114' None None None ]
['P113' None None None None None ]
['P113' None None None None None ]
['VCCA_1' None None None None None ]
```

```
[ 'PIN 2_weight' 'PIN 2_weight'
[ 9 8 None None None None ]
[ 9 8 None None None None ]
[ 9 8 None None None None ]
[ 9 9 None None None None ]
[ 9 9 None None None None ]
[ 9 7 9 8 None None ]
[ 9 7 7 9 None None ]
[ 9 7 7 9 None None ]
[ 9 7 7 7 9 8 ]
[ 9 9 None None None None ]
[ 9 9 None None None None ]
[ 9 7 9 None None None ]
[ 9 7 9 None None None ]
[ 9 7 7 None None None ]
[ 9 7 7 None None None ]
[ 9 7 9 None None None ]
[ 9 7 9 None None None ]
[ 9 9 None None None None ]
[ 9 9 None None None None ]
[ 9 7 0 None None None ]
[ 0 None None None None None ]
[ 0 None None None None None ]
[ 0 None None None None None ] ]
```

FIG. 13

INTEGRATED CIRCUIT SPIKE CHECK TEST POINT IDENTIFICATION APPARATUS AND METHOD

CROSS-REFERENCE TO RELATED APPLICATION

This application claims priority to, the benefit of the filing date of, and hereby incorporates herein by reference: U.S. Provisional Patent Application No. 62/703,707, entitled "Robotic Spike Detector," filed Jul. 26, 2018.

BACKGROUND

The example embodiments relate to post-silicon integrated circuit (IC) spike testing and, more particularly, to apparatus and methods for improving such testing.

As IC design and manufacturing have become more complex, for example due to more complex circuit designs and intricate manufacturing processes, there are various stages of pre-silicon IC design verification and post-silicon IC device testing. Ultimately, when an IC design is finalized and the corresponding IC units from the design are produced in large quantities, often some or all of the individual ICs are tested using computerized automated test equipment (ATE) that works in concert with certain physical testing apparatus. For example, the ATE may execute test program instructions in conjunction with an electromechanical device known as a prober. The test program provides a sequence of IC test signals to the prober, using ATE-provided resources (e.g., digital, analog, timing, high-power, high precision, and the like). The prober typically has a number of stationary pins (or needles) that provide touch points to the IC when it is still in wafer form, where the wafer includes a number of IC regions and nominally each such IC region presents a same circuit design, typically separated from the others by scribe lines or some other delineation as between separate IC regions on the wafer. The prober further includes apparatus, sometimes referred to as a wafer chuck, for sequentially moving the wafer, and hence its IC regions, so that over time each IC region is positioned to contact the stationary pins. Once such contact is established, the signals received by the prober based on the test program are applied to the IC region, so as to test that particular region. Once an IC region is fully tested, the wafer chuck moves (or steps) the wafer to a new position, so that a next untested wafer IC region contacts the test pins and is then tested, and the process thereafter repeats for all wafer IC regions. Testing of this sort allows defective IC regions to be indicated, and discarded for example, or if only certain tests fail, the IC region can be marked or designated if a portion of the region is still usable as a singulated IC device, albeit for lesser performance than if all testing had passed. While use of a prober is one type of ATE test program application, another application can be to final, singulated IC packages. This application is sometimes referred to as final test, which also involves some level of automation as each of many IC packages are test. For example, an electromechanical apparatus (e.g., handler) can physically move each IC package into a socket on a board, where the IC package remains while the ATE executes the test program, thereby communicating signals between the ATE and the board/in-socket IP package. Once the test is complete, the electromechanical apparatus removes the tested IC package and replaces it with the next, to-be-tested, IC package, and the process is repeated. Also, as in the case of wafer testing, each final test singulated device is sorted or otherwise indicated, based on the extent to which it passes the ATE test program.

While the above post-silicon testing can reduce defective ICs from entering the marketplace, such results depend on the efficacy of the ATE test program. For example, if the ATE test program is not properly developed, then the program itself can cause beyond-specification signals to be applied during testing, potentially damaging ICs rather than testing them. Accordingly, also known in IC manufacturing is what is referred to as spike testing of the ATE program. Spike testing in general may refer to testing a system using extreme values of input, typically in short periods. In the context of present example embodiments, however, the spike testing is of the ATE program, in an effort to ensure that post-silicon ATE testing using that program does not exceed permissible signal magnitudes. Accordingly, spike testing (or spike checking) is the process of detecting transient signal spikes that violate the operational specification conditions of the IC when subjected to the ATE test program, and further locating, identifying, and correcting the cause of the spikes.

ATE test program spike checking is first typically performed by one or more test engineers on a sampling of one or more ICs in final singulated and packaged form, but before the ICs are manufactured in large quantities that undergo the above-described probe testing. Additionally, if the ATE test program is revised, it often must undergo an additional spike checking test, so as to ensure the revised test program does not create a spike(s) during use of the test program. For either initial or later revisions of the test program, the IC to be spike checked is placed in a socket, which is typically coupled by an interface to a board that may be referred to, as examples, a test board, load board, or handler interface board (HIB). The test board is essentially a large printed circuit board (PCB), with components and electrical contacts points that can number in the thousands attached to the board to facilitate testing. Typically the socket for receiving the IC is on an upper surface of the board so as to be accessible by the test engineer, while the bottom surface of the board contains a number of electrical contact points that can be accessed by test head pins that communicate with the ATE, so as to apply the test program signals, via the test board, to an IC positioned in the socket. Often a test board will include plural sockets, so that a corresponding plural number of ICs (sometimes referred to as sites) may be concurrently tested by the ATE test program.

Contemporary ATE test program spike checking can be laborious, time-consuming, subjective, and prone-to-human error. During spike checking, a test engineer starts the ATE test program, and then physically manipulates a probe tip to make electrical contact to selected points (test point) that the engineer selects among what may be thousands of options on the test board. Accordingly, before applying the probe tip to a desired test point, that point must be identified, where typically the engineer subjectively selects each test point based on test board schematics, layout drawings, visual inspection of the test board, experience, and information from others. While the ATE test program runs, the engineer is tasked to maintain the probe-to-test point contact for the duration of the program sequence. Maintaining the probe tip in contact with the test point is itself subject to failure, if the contact is temporarily or prematurely interrupted. Sometimes an engineer will devise or obtain some type of clamping mechanism to assist, which can be imprecise or unreliable based on the mechanism, its application, and the spatial constraints on or around the test board. Further, the probe is also connected to an oscilloscope, so that while the test program runs, and the probe-to-test point contact is maintained, the engineer also is tasked to observe the oscilloscope screen to watch the signal over the full duration of the test, requiring the engineer's presence during the entire test. Further, the oscilloscope output must be watched to ensure that the signal at the test point does not exceed (spike beyond) the IC specifications, again during the entire duration of the ATE test sequence. Often an engineer will set the oscilloscope time sweep (time/div) slow enough so that the signal sweep observed over the entire duration of the test can fit within the oscilloscope screen. However, in doing so, any spikes that are sufficiently fast (e.g., microseconds or nanoseconds) will not be perceptible to the human eye due to the oscilloscope time setting, so the engineer may fail to identify such spikes, thereby defeating the purpose of the spike test. Still further, when a spike is observed, the engineer has to identify where in the test program the spike occurs, so as to indicate that timing for later correction to the test program. Such a spike time/program sequence identification can require repetitions of the test, at different oscilloscope time durations. And still further, for high pin count ICs, time consumption is considerable. Consider a 64-pin IC requiring 10 minutes of spike checking per pin—this is 640 minutes or over 10.5 hours. Consider further the same testing for 16 ICs—non-stop such an endeavor is over 7 days. Given the preceding, sometimes spike checking an ATE test program is given insufficient time or omitted altogether, as it can require too much time and effort. However, eliminating the spike check then increases risk that that ATE test program will be later used for large quantities of ICs and potentially damage them rendering them either unusable immediately from the test, or more prone to premature failure in the field.

Accordingly, example embodiments are provided in this document that may improve on certain of the above concepts, as further detailed below.

SUMMARY

A nontransitory computer-readable program storage medium having stored thereon program instructions is described. The program, when executed by a processor, has the processor capable of receiving a set of input data, the input data comprising a first form of test board attributes. The attributes comprise identification of devices coupled to the test board, and the test board comprises a plurality of conductive surfaces. Each conductive surface, in the plurality of conductive surfaces, is for electrical communication with a respective pin of a plurality of pins of a device under test. The program, when executed by a processor, is also capable of transforming the set of input data into test board mapping data. The test board mapping data comprises, for each of the conductive surfaces, an ordered listing of potential test points along a path that couples to the conductive surface, wherein the potential test points are derived from at least one of the test board attributes. Further, the program, when executed by a processor, also is capable of identifying, for each of the conductive surfaces, a selected test point from among the one or more potential test points, the selected test point for spike check probing of the device under test.

Other aspects are also disclosed and claimed.

BRIEF DESCRIPTION OF THE DRAWINGS

FIG. 12 illustrates a path matrix for the paths from Pin2 in the circuit configuration of FIGS. 11A-11B.

FIG. 13 illustrates a weighting matrix for the paths from Pin2 in the circuit configuration of FIGS. 11A-11B.

DETAILED DESCRIPTION

Example embodiments facilitate and improve ATE test program spike checking apparatus and methods, which necessarily also facilitate and improve changes to the ATE test program. Such improvements reduce or eliminate spikes in subsequent large-scale ATE testing of ICs. Accordingly, example embodiments provide practical applications in new apparatus and methods that improve IC production, for example by reducing both IC manufacture cost and frequency of IC failure. As examples, described below are: (i) an electromechanical apparatus for positioning a probe tip, or differential probe tips, on selected test points on an IC test board; and (ii) programing, including novel processing steps and data sets, for mapping test board information to control and refine the selection of test points, for example to control the electromechanical apparatus. For both examples, a test point is a physical location on the IC test board that can be physically and electrically accessed by an external signal detector or generator, for example from either the top or bottom of the test board and by way of a solder ball, through-hole component, header pin, or other probe reachable conduction point.

Figure 1:
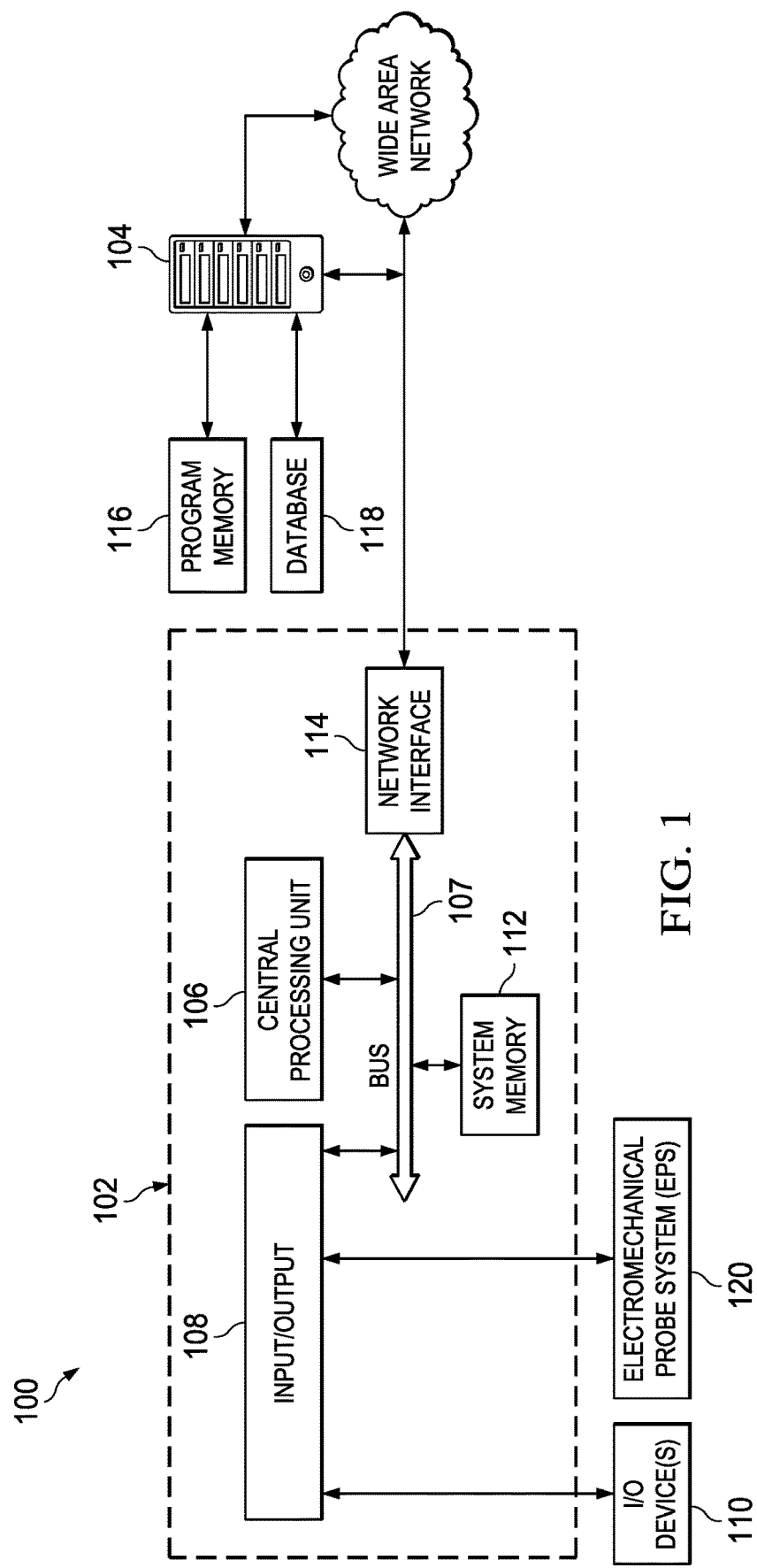
FIG. 1 illustrates an example embodiment of a computational system, as a form of automated test equipment (ATE), in combination with an electromechanical probe system (EPS).

FIG. 1 illustrates an example embodiment of a computational system 100, as a form of automated test equipment (ATE). Specifically, example embodiments include tools and techniques that are contemplated as implemented, at least in part, by computational system 100, to ascertain spike test points on a test board and electromechanically position one or more probe tips with respect to selected test points. Computational system 100 thereby facilitates the calculations, operations, data sets, and steps intended and required perform the above-introduced aspects. In this example, computational system 100 may be realized by way of a computing system 102 connected to a server 104 by way of a network, where the network may be one of various networks, including a wide area network such as the global internet. In this sense, computing system 102 may be a local device that communicates with the internet, and where server 104 and its related architecture and software are hosted on another network accessible station or node. Of course, the particular architecture and construction of a computer system useful in connection with the example embodiments may vary widely. For example, computing system 102 may be realized by a single personal computing device, such as a conventional workstation, personal computer, or alternatively by a computer system implemented in a distributed manner over multiple physical computers and may include signal resource provision typically associated with IC ATE. Accordingly, the generalized architecture illustrated in FIG. 1 is provided by way of example.

With more detail as to computing system 102, it includes a central processing unit (CPU) 106, coupled to a system BUS 107. Also coupled to system BUS 107 is an input/output (I/O) interface 108, which communicates either through wireless or wireline forms (e.g., RS-232, Universal Serial Bus) with peripheral I/O devices 110 by which a user may input or receive information provided to or from computing system 102. Peripheral I/O devices 110 may include one or more of various devices, such as a keyboard, display, camera, microphone, scanner, media reader, speaker, buttons, touch screen, printer or printer communications, or the like, and further including as detailed later, an oscilloscope (see FIG. 2). CPU 106 refers to the data processing capability of computing system 102, and as such may be implemented by one or more CPU cores, co-processing circuitry, and the like. The particular construction and capability of CPU 106 is selected according to the application needs of computing system 102, such needs including, at a minimum, the carrying out of the functions described in this document, and also including such other functions as may be executed by computing system 102. In the architecture of computing system 102 according to this example, a system memory 112 is coupled to system bus 107, and it provides memory resources of the desired type useful as data memory for storing input data and the results of processing executed by CPU 106, as well as program memory for storing the computer instructions to be executed by CPU 106 in carrying out those functions and others described in this document. This memory arrangement is only an example, it being understood that system memory 112 can implement such data memory and program memory in separate physical memory resources, or distributed in whole or in part outside of computing system 102.

Computing system 102 also includes a network interface 114 that is conventional in nature of an interface or adapter by way of which computing system 102 accesses network resources. Interface 114 may include various types of wireline or wireless couplings, the latter including radio communication apparatus for communications such as cell, WiFi, Bluetooth, and other known or ascertainable communication protocols and standards. In all events, interface 114 provides computing system 102 access to network resources, including server 104, which also may be accessible on a smaller (e.g., local area) network, or a wide-area network such as an intranet, a virtual private network, or over the Internet; hence, via those arrangements, various wireline and wireless communications may be achieved. In this embodiment, server 104 is a computer system, of a conventional architecture, and as such includes one or more central processing units, system buses, and memory resources, network interface functions, and the like. According to an example embodiment, server 104 has access to a program memory 116, which is a computer-readable medium that stores executable computer program instructions, according to which the operations may be executed and so as to communicate information to, and receive information from, computing system 102. Server 104 also has access to a database 118, in which various data may be written and read.

Returning to I/O interface 108, it also is bi-directionally connected to communicate with an electromechanical probe apparatus (EPA) 120. EPA 120 is also an I/O device, in the sense of its bi-directional communications with computing system 102, but it is shown separately to align with various concepts introduced above and detailed below. Thus, EPA 120, as part of computational system 100, includes processor control (e.g., by computing system 102) for electromechanically positioning a probe tip(s) on selected test board test points, where such test points may be selected, for example, according to novel programing and data sets that respond to novel test board mapping.

In an example embodiment, computer program instructions are executed by both computing system 102 and server 104, and distribution of programming and data may be allocated between the two (or other CPU(s)) by one skilled in the art, including between the respective memory resources. For example, these data and program instructions may be stored in local system memory resources 112 within computing system 102, within server 104, program memory 116, database 118, or in network-accessible memory resources to these functions. In addition, each of these data and program memory resources can itself be distributed among multiple locations. It is contemplated that those skilled in the art will be readily able to implement the storage and retrieval of the applicable data, computations, and other information useful in connection with example embodiments, in a suitable manner for each particular application.

According to example embodiments, system memory 112 and program memory 116 store computer instructions executable by CPU 106 and server 104, respectively, to carry out the functions described in this document. These computer instructions may be in the form of one or more executable programs, or in the form of source code or higher-level code from which one or more executable programs are derived, assembled, interpreted, or compiled. Any one of a number of computer languages or protocols may be used, depending on the manner in which the desired operations are to be performed. For example, these computer instructions for determining test board test points and controlling electromechanical placement of a probe on a selected test point according to example embodiments may be written in a conventional high level or test language, either as a conventional linear computer program or arranged for execution in an object-oriented manner, or in numerous other alternatives. These instructions also may be embedded within a higher-level application. Data, including modeling of the test board and components associated with it, novel data structures relating to test board signal paths and weighted test point matrices, as well as of a device under test (DUT) that can be located in the test board socket, also may be in various formats. For example, the test board and DUT model may be provided in a register-transfer level (RTL) design abstraction, as used in hardware description languages (HDLs), like Verilog and VHSIC hardware description language (VHDL), or a simulation model used for describing analog circuits or analog mixed signal (AMS) circuits (where AMS includes some digital circuits as well), or provided by third party manufacturers, for example in connection with schematic and other node data for the test board.

In any case, those skilled in the art having reference to this description will be readily able to realize, without undue experimentation, example embodiments in a suitable manner for the desired functionality. These executable computer programs and data modeling for carrying out embodiments may be installed as resident within computing system 102 as described above, or alternatively may be in the form of an executable network-based application that is accessible to server 104 and communicable in part or whole to computing system 102 for receiving inputs from the user, executing algorithms modules at a web server, and providing output to the user at some convenient stored, displayed, or printed form. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions originally may have been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by computing system 102 in the conventional manner for software installation.

Figure 2:
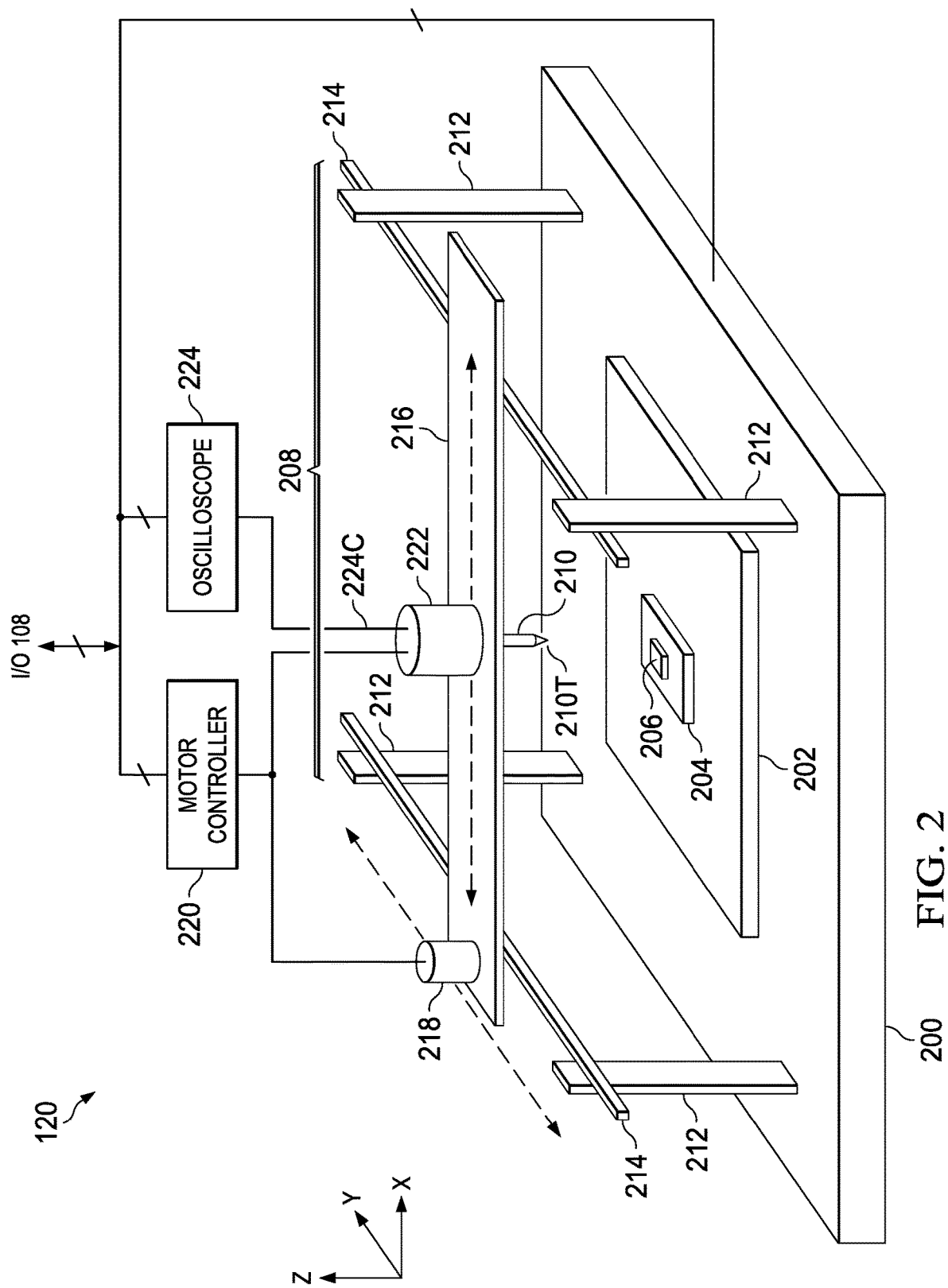
FIG. 2 illustrates a perspective representative diagram of the EPS from FIG. 1 in greater detail.

FIG. 2 illustrates a perspective representative diagram of EPA 120 from FIG. 1, in greater detail. EPA 120 includes a test head 200, on which a test board 202 is located at a stationary position. Test head 200 includes, while not shown, a number of pins, sometimes referred to as a nail bed, beneath test board 202 for making contact with electrical contacts on the underside of test board 202. Accordingly, when computational system 100 executes a test program, signals may be communicated between computing system 102 and test head 200, via I/O interface 108. Moreover, the top side of test board 202 includes an interface contactor 204 that includes an IC socket 206, into which a singulated and packaged IC (not shown) may be positioned as a DUT. Accordingly, the IC DUT pins align with conductors in IC socket 206, and IC socket 206 provides respective conductive paths between those pins and conductive surfaces or contacts on test board 202. Thus, when signals communicate between computing system 102 and test board 202, they also can communicate further to an IC DUT in socket 206. While FIG. 2 illustrates only a single interface contactor 204, test board 202 may include multiple sockets, each for receiving a respective IC and so that collectively multiple ICs, in respective multiple sockets, may be concurrently tested with signals from computing system 102.

EPA 120 also includes an electromechanically movable probe system 208. System 208 includes a probe 210 so that the probe, and its tip 210T, can be moved under electrical control in any of three dimensions shown in FIG. 2 as the x, y, and z dimensions. By way of example, movable probe system 208 includes a base having adjustable legs 212 that support y-dimension rails 214 above test board 202. Adjustable legs 212 define a frame that may be separable items or a portion of a larger either multi-piece or integral member, which may include other positional members described below, all of which cooperate with position relative to the stationary test board 202. In example embodiments, the distance between adjustable legs 212 can be altered, either mechanically or under control of signals and additional actuators (not shown), so for example the spacing between legs 212 can be adjusted to accommodate dimensions of one or both of test head 200 and test board 202, as well as the vertical positioning of the supported y-dimension rails 214. An x-dimension rail 216 is movably (in the y-dimension) supported by the y-dimension rails 214, such as by one of various mechanisms (e.g., cooperative rails, tongue-in-groove, cylinder through hole, or the like). Movement of x-dimension rail 216, perpendicularly along the y-dimension rails 214, is controlled by an actuator 218, such as an electrical or pneumatic motor, in response to control signaling communicated to a motor controller 220, the signaling received, via I/O interface 108, from computing system 102. A combined x/z dimension processor-controlled actuator 222 is movably supported on the x-dimension rail 216. Particularly, x/z processor-controlled dimension actuator 222 may move in the x-dimension along the length of x-dimension rail 216, such as by motor movement and in cooperation with a similar mechanism as discussed above with respect to y-dimension rails 214. Independent of movement in the x-dimension, x/z dimension processor-controlled actuator 222 also may move probe 210 in the z-dimension, so that tip 210T makes controlled contact with a selected test point on test board 202. In an example embodiment, such contact is desirably outside the perimeter of interface contactor 204, so that the probe does not make contact with either the contactor 204 or IC socket 206 (or an IC therein), for purposes of avoiding damage or unintended consequences or signal reads within that perimeter. Accordingly, the probe tip contact area on test board 202 is preferably outside the perimeter of interface contactor 204, and in that area numerous (potentially thousands) of possible test points are located (but not shown). Lastly, EPA 120 includes an oscilloscope 224, connected by a cable 224C to probe 210 and by an interface (e.g., USB) to computing system 102, for example by I/O interface 108. While not shown, oscilloscope 224 also may be mounted with respect to test head 200 and/or movable probe system 208.

Figure 3:
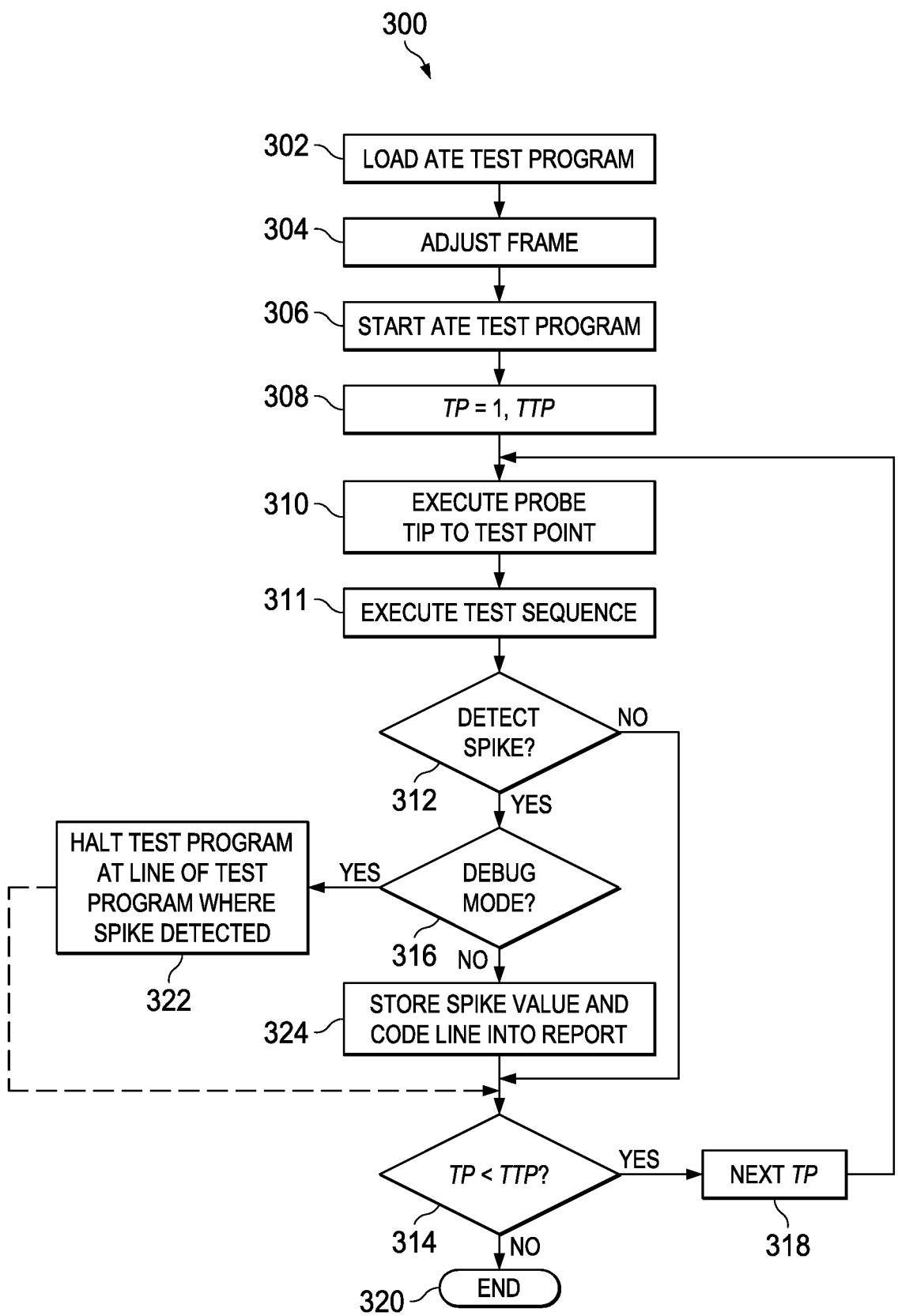
FIG. 3 illustrates a flowchart of an example embodiment method as may be performed by the FIG. 1 system in connection with ATE test program spike checking and logging.

FIG. 3 illustrates a flowchart of an example embodiment method 300, as may be performed by computational system 100 in connection with ATE test program spike checking and logging. Method 300 is provided by way of example, where the teachings of this document also facilitate the addition, deletion, or re-ordering of one or more steps in method 300. Further, a flowchart is used by way of example as to step sequencing, but other forms (e.g., state diagram) also may be used to demonstrate the flow, from which adequate programming of computational system 100 may be provided. Method 300 starts with a step 302. In step 302, a user causes an ATE test program, appropriate for the applicable test board 202 and IC in socket 206, to be loaded into computational system 100. Accordingly, example embodiments contemplate that computational system 100 may store, or have access to, multiple different ATE programs, based on one or both of test board 202 and the to-be-tested IC. Next, method 300 continues from step 302 to step 304.

In step 304, the frame of movable probe system 208 is spatially adjusted so as to accommodate any size/positioning considerations of one or both of test head 200 and test board 202. For example, adjustable legs 212 may be positioned so as to have proper alignment and orientation with respect to test board 202, so that later movements of probe 210 are spatially properly with respect to a desired intended target. The proper orientation and adjustment of movable probe system 208 may be assisted by physical fitment between the frame and test head 200, as well as electronically guided mechanisms, for example including an optical recognition sensor that detects alignment indications on test board 202, whereby electromechanical adjustment of the frame can be achieved, or finely adjusted, so as to correct any misalignment detected by the optical recognition. Alternatively, step 304 may be achieved in part or whole by a user manually adjusting the spatial relationship of the probe system 208 to either test board 202 or test head 200. Next, method 300 continues from step 304 to step 306.

In step 306, the test sequence of the loaded ATE test program (e.g., of step 302) is enabled to execute. Step 306 may be achieved by a user cooperating with an appropriate interface (e.g., graphical user interface (GUI)) of computational system 100 and/or any control on EPA 120, and given the networking interface of computational system 100 may even be commenced at a distance remote from test board 202. Notably in contrast to the prior art, the ATE test program commences execution without the user having manually probed any test point of test board 202. Moreover, the user's involvement with the spike checking thereafter can be minimal and, indeed, the user need not be contemporaneously involved with, or at the location of test board 202, for the remainder of the spike checking of the ATE test program. In all events, the steps of method 300 following step 306 all may be achieved through computational system 100 programming and electrical control of EPA 120. Next, method 300 continues from step 306 to step 308.

In step 308, computational system 100 sets an index TP to a value of one. The TP index is used as an advancing loop control for each test point on test board 202, which each test point selected by computational system 100 and under which control is provided to EPA 120 so that the test point is probe contacted for spike checking. Accordingly, step 308 indicates that index TP starts at a value of one, and will continue until a total of all test points, TTP, have been processed. For example, the total TTP may be equal to the number of pins on the IC DUT in socket 206. Next, method 300 continues from step 308 to step 310.

In step 310, computational system 100 executes probe contact to the (x, y, z) coordinate of a desired test point on test board 202. The specific test point may be earlier determined and programmed into the sequence, or the coordinate may be determined (or read from storage) during step 310. The coordinate determination, whether earlier or during step 310, may be in response to user input (e.g., by keyboard, mouse, joystick, or other I/O device), where the user is located near or remote (e.g., different room, different building, or even different city/state/country/region) from computational system 100, for example, in high voltage test solutions that require closed physical enclosures around the test board for safety reasons and so that it is extremely difficult to manually probe anything on the test board. Alternatively, the coordinate determination may be by a processor-based system, whether computational system 100 or otherwise, which identifies preferred test points (and corresponding coordinates) in response to determined signal path matrices, and test point weighting along those paths, as detailed later. In any event, in step 310 computational system 100 transmits appropriate control signaling to motor controller 220 of EPA 120, which correspondingly controls a collective actuator apparatus of actuators 218 and 222 to move probe 210 to a corresponding (x, y) position above test board 202, and again outside the perimeter of interface contactor 204. Next, processor-controlled actuator 222 advances probe 210, and hence its tip 210T, downward in the z-dimension until tip 210T contacts the desired test point, for the current loop index of TP. Additionally, while movement of probe 210 and its tip 210T are described as separable in x-, y-, and z-dimensions, such movement may occur in differing orders or simultaneously so as to desirably position tip 210T to a test point. In addition, processor-controlled actuator 222 also may include an appropriate mechanism so as to angle probe 210 in a direction other than vertical as shown, so that a controlled, non-vertical angle of approach can be achieved in bringing tip 210T in contact with the test point, thereby permitting probing in tight spaces, around other items, or in other desirable conditions. Further, in example embodiments, probe 210 may include some level of spring-loading or other compressible mechanism or adaptability so that the force of contact by tip 210T to the desired test point is sufficient and/or constant during testing, while not exceeding a limit beyond which damage could occur to the test point or probe. Additionally as detailed later, the probe-guiding signal path matrices may include topographical data that characterizes the z-dimension height of the desired test point, so that processor-controlled actuator 222 is controlled in its downward advancement of probe 202 based on a limit established from that data as it pertains to a given test point—thus, different test points of different z-dimension heights are accommodated by such data and a variable z-dimension control by processor-controlled actuator 222. Accordingly, for a test point that is above the surface of test board 202, for example on a lead of an added external component, processor-controlled actuator 222 limits the downward movement of probe tip 210T only to the height of the component touch point, and not all the way to the surface of test board 202. Still further, example embodiments may include signal monitoring and detection as the probe is advanced to the desired test point, so that probe-to-test point contact is determined by computational system 100 to be sufficient, for example with the probe no longer moved in the z-direction, once the signal (e.g., in its signal-to-noise ratio (SNR)) changes (e.g., increases) beyond a predetermined threshold. Next, method 300 continues from step 310 to step 311.

In step 311, appropriate settings are selected on oscilloscope 224 and computational system 100 executes the test sequence. In more detail, once the step 310 probe-to-test point contact is established, any signal at that test point is coupled by cable 224C to oscilloscope 224, which in turn is coupled to computational system 100. Accordingly, oscilloscope 224 is adjusted based on the particular DUT pin that corresponds to the then-contacted test point. Specifically, over the entire duration of method 300, it is contemplated that for every iteration, before the test program is executed in step 311, the oscilloscope horizontal, vertical, and trigger level settings are adjusted based on the absolute maximum/minimum specifications of the DUT pin then under test (that pin corresponding to the current TP-indexed touch point)). Indeed, over the entirety of all method 300 iterations, it is contemplated that for every test point that is tested, the test program executes three times, each time corresponding to a different set of oscilloscope settings, as follows: (i) oscilloscope settings are adjusted to capture the entire test program waveform for the current test point (for documentation and to help with debug); (ii) oscilloscope settings are adjusted to detect potential absolute maximum voltage spikes; and (iii) oscilloscope settings are adjusted to detect potential for absolute minimum voltage spikes. Consistent with these teachings, once probe tip 210T contacts the TP-indexed touch point from step 310 and the selected one of three oscilloscope settings are selected in step 311, computing system 102 executes the test program sequence. Next, method 300 continues from step 311 to step 312.

In step 312, computational system 100 determines whether a spike is detected at the TP-indexed test point. Specifically, once the step 310 contact to test point is established, any signal at that test point is coupled by cable 224C to oscilloscope 224, which in turn is coupled to computational system 100. Accordingly, once the test sequence is executing from step 310 and until it completes for the current test point, step 312 monitors the signal at the current test point and compares it to the specification limit for that test point (for the DUT pin corresponding to the test point). For example, if the test point corresponds to a DUT power (VCC) pin, and the DUT has a specification limit of VCC=3.3V, then step 312 monitors the test point voltage to determine if it exceeds the specification limit of 3.3V. Alternatively and described later, step 312 may compare a differential voltage, from differential probes, to a specification limit. If step 312 does not detect that the test point signal exceeds the test point specification limit, then method 300 continues from step 312 to step 314. Alternatively, if step 312 detects that the test point signal exceeds the test point specification limit, then such a result is deemed a spike and method 300 continues from step 312 to step 316. Each of these alternative method flow paths is described below.

In step 314, computational system 100 evaluates a conditional check on the loop index TP, comparing it to the total number of test points TTP to be spike checked (where TTP can be total points, or total points time three if each point is to be test three times, per different oscilloscope settings as described above). If TP is less than TTP, method 300 proceeds to step 318 to advance (e.g., increment) the TP index to its next value, and control returns to step 310 to repeat for the determination of a next test point, and for EPA 120 to advance probe 210 to contact the next test point after which computational system 100 executes the test program sequence while the signal at that next test point is sampled and monitored for potential spiking beyond the DUT specification. If TP is not less than TTP, then method 300 continues from step 314 to step 320.

In step 316, computing system 102 evaluates whether the user has selected a debug mode, as may be achieved in the above-described GUI in either step 302 or 306. If debug mode is selected, method 300 continues from step 316 to step 322. In step 322, computing system 102 halts the test program at the executing line of test program where the step 312 spike was detected. Once the test program is so halted, a user of EPA 120 may take additional steps to evaluate considerations of the spike and test program code that caused it. For example, the user may modify (or have modified) the test program to avoid the spike from being caused in future iterations of the program. Such modification thereby eliminates that spike possibility in later larger-volume testing, for example of either prober-tested wafers or final test singulated devices, that include the same DUT design being tested by EPA 120. While not shown, step 322 also may include some form of communication to a user that the test program has been interrupted by a spike detection in the debug mode, so that the halt can be timely addressed. Additionally, once any debug process is performed in connection with step 322, optionally spike testing may resume by method 300 continuing from step 322 to step 314, as shown in FIG. 3 by a dashed arrow. Alternatively in step 316, if the debug mode is not selected, method 300 continues to step 324. In step 324, computational system 100 stores information relating to the detected spike event, for example into memory, a table, a document or the like, any for later reporting and analyses. The type of information stored may include, as examples, the magnitude of the spike and the line of test program code that was executing (or just executed), or the proximate block of test program code, when the spike occurred and was detected. Once this information is stored, method 300 continues from step 324 to step 314.

Step 314 was described earlier as reachable from step 312 when a spike is not detected at a test point for the duration of a test program sequence (or optionally to resume follow debug in step 322), and now also has been shown to be reachable when a spike is detected, and because computational system 100 is not in debug mode, information with respect to the spike has been stored into a report. In either event, the TP index is considered and incremented if not all test points have been processed, and the process loops until all such test points are processed. Once that occurs, method 300 continues from step 314 to step 320, where method 300 ends.

Once step 320 is reached, from the preceding it should be appreciated that a number of TTP test points have been contacted by probe 210, and for each test point a test program sequence has been executed at least once, or in an example embodiment as described above, each test point is tested with three sequences of the test program, each of the three sequences corresponding to a different set of oscilloscope settings. Further, for any spike that occurred for any such test point, and provided the program was not in debug mode which would have halted the test program upon a spike detection, a report has been stored for the detected spike. From this report, one skilled in the art may locate, identify, and correct the cause of the spikes, for example either in the test program, or the design of test board 202 or the DUT. Accordingly, example embodiments provide numerous benefits. For example, much or all of the test program spike check process is automated without requiring the presence of one or more people during the test. As another example, spike check can be more repeatable and consistent, either for multiples of the same DUT at different sites or for different DUTs at different times, reducing human error, subjectivity, and overall test timing. As other examples, probe contact may be applied with uniform (or selectable and controlled) angle of incidence to a contact point, uniform (or selectable and controlled) contact pressure, and within confines or for consistent durations unattainable by a human-held probe. As yet another example, EPA 120 may operate without immediate or proximate human intervention, permitting for example testing to occur in longer uninterrupted durations or during off-peak times.

Figure 4A:
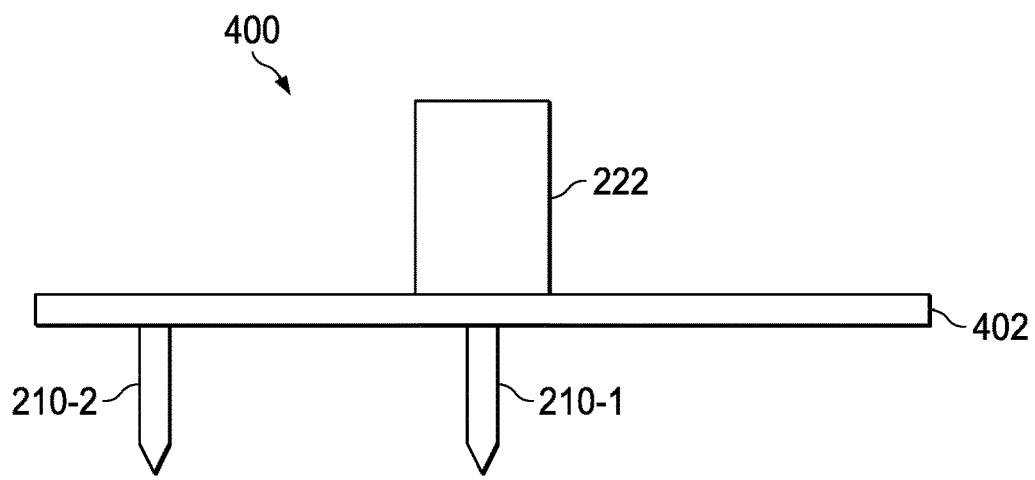
FIG. 4A illustrates an elevation view.
Figure 4B:
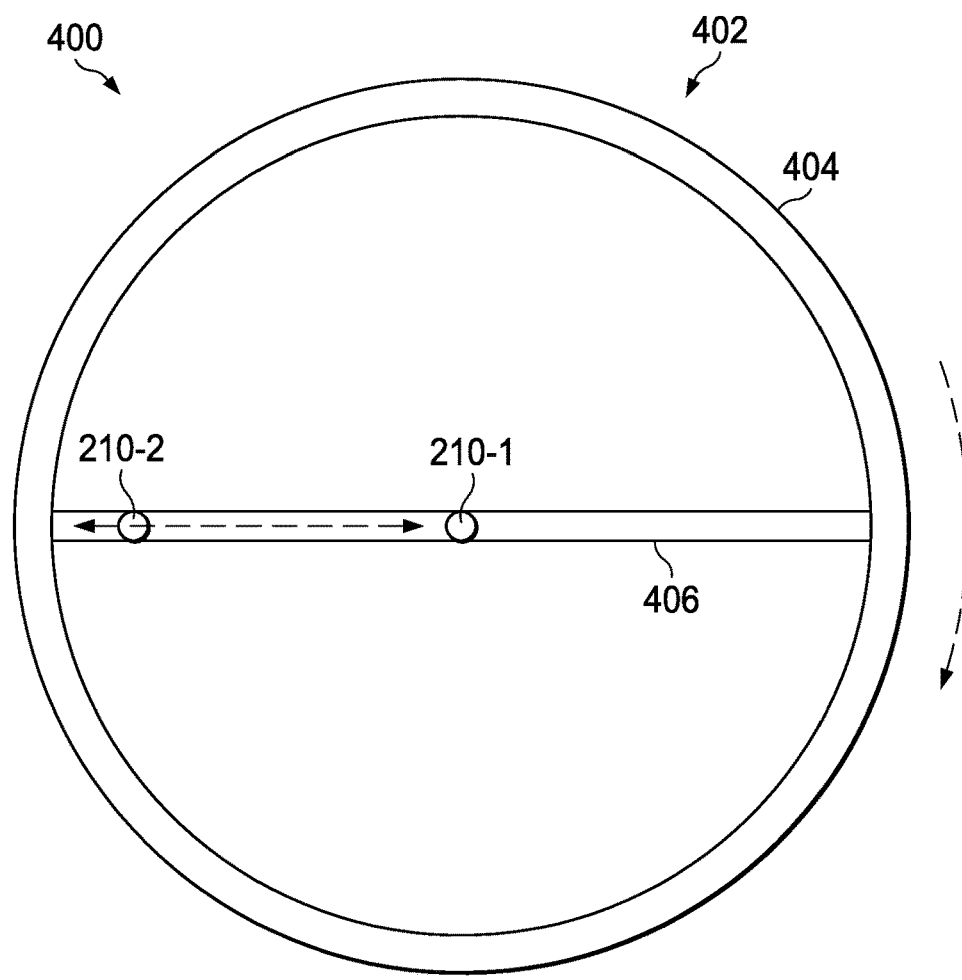
FIG. 4B illustrates a plan view, of an example embodiment of a dual-probe apparatus that may be used in lieu of the single probe shown in FIG. 2.

FIG. 4A illustrates an elevation view, and FIG. 4B illustrates a partial plan view, of an example embodiment of a dual-probe apparatus 400 that may be used in lieu of probe 210 of FIG. 2, along with appropriate modification to x/z dimension processor-controlled actuator 222. Processor-controlled actuator 222 is shown in FIG. 4A (not in FIG. 4B for simplicity) as coupled to a probe displacement member 402, to which are physically attached two probes 210-1 and 210-2, where at least one of the probes is movable relative to displacement member 402, by control of processor-controlled actuator 222. As perceptible from FIG. 4B, displacement member 402 includes an annulus outer member 404 and a diametric rail 406 positioned across the diameter of annulus outer member 404. Probe 210-1 is centered along diametric rail 406 (and hence, also with respect to annulus outer member 404). Probe 210-2 is movably fixed to diametric rail 406 along a rail, slot, guide, or the like, as indicated by the dashed bi-directional arrow, intended to depict that probe 210-2 may be moved radially, for example under control of processor-controlled actuator 222, between an outer position limited by the radius of rail 406 and an inner position limited by the central location of probe 210-1, that is, probe 210-2 is prevented from physically (and electrically) contacting probe 210-1. Lastly and while not shown, displacement member 402 includes sufficient apparatus under control of processor-controlled actuator 222 so that each of probes 210-1 and 210-2 may be positioned to different heights relative to test board 202, for example causing the tip of either one or the other, or both probes, to concurrently contact respective test point(s), but not necessarily at the same z-dimension heights.

The operation of dual-probe apparatus 400 permits probe contact of a respective one or two test points on test board 202. For example, where only one test point contact is desired, only one of the two test probes is advanced to the appropriate (x, y) coordinate and moved by processor-controlled actuator 222 to a sufficient downward position to touch the desired test point, leaving the other probe at a relatively elevated height (out of contact with test board 202 or its components). When two test points are indicated for concurrent probing, for example to receive two different signals from which a differential between the signals may be analyzed, then processor-controlled actuator 222 positions probe 210-1 above a first test point, and then processor-controlled actuator 222 rotates annulus outer member 404, and advances probe 210-2 radially along rail 406, so that an appropriate spatial relationship is created between the tip of probe 210-2 and the tip of probe 201-1, after which each probe is lowered a respective appropriate distance to contact a respective test point. Once each touch point is so contacted, a respective channel for each probe can be sampled. Alternatively, the probes can provide a differential signal which allows oscilloscope 224 to trigger based on a difference between the two signals, as may be required for spike checking. In addition, the illustrated two-probe system permits one or the other of the probes to be a ground, thereby avoiding the need for a separate ground such as by a vulnerable ground wire that also may be affixed to a single, non-movable (or at least not easily moved or moved by automatic) position. Still further, various of the above-described benefits for a single probe can be realized either individually or even enhanced by applying to concurrent use of dual probes.

Figure 5:
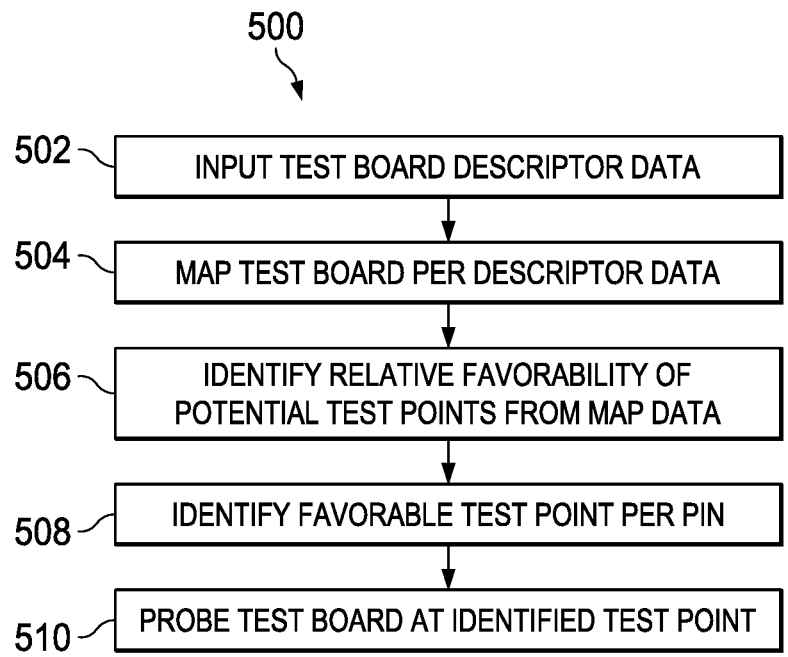
FIG. 5 illustrates a flowchart of an example embodiment method as may be performed by the FIG. 1 system for identifying a desired probe test point among the numerous different possible test points provided by a test board.

Having detailed an apparatus capable of electromechanically advancing a probe (or probes) to a test board 202 test point, FIG. 5 illustrates a flowchart of an example embodiment method 500, as may be performed by computational system 100, for identifying a desired spike checking probe test point among the numerous different possible test points provided by test board 202. As was the case for method 300 described earlier, method 500 is provided by way of example, where the teachings of this document also facilitate the addition, deletion, or re-ordering of one or more steps in method 500, and a flowchart is used by way of example as to step sequencing, from which adequate programming of computational system 100 (or other systems) may be provided. In an example embodiment, the method 500 test point identification cooperates with EPA 120, although its output test point(s) may be used with other apparatus, including but not limited to other probe contacts, whether by machine or human assistance.

Method 500 starts with a step 502. In step 502, a user inputs test board descriptor data to computational system 100, including to a program that is executing or executable by computational system 100. The test board descriptor data is associated with a respective test board, such as test board 202. Such descriptor data, as used in this document, is intended to be available electronically-readable data that describes any attributes that identify device layout ((x, y) locations and topographical, including the z-dimension and on which test board surface, upper or lower, the device is located, if available), devices, electrical connections, signal names, part number, and still others, as may be used for the methods and apparatus described herein. For example, such data may be in the format of electronic design or electrical schematic netlists (e.g., each instance of components, connectivity, and sometimes component attributes) and Gerber files, where Gerber is a standardized file format (e.g., ASCII) that provides design information for PCBs. Next, method 500 continues from step 502 to step 504.

In step 504, the appropriate test or other processor programming of computational system 100 executes, and it maps the test board from the step 502 descriptor data. The mapping transforms the input data by deriving processor-mapped signal paths from that data, each signal path leading from (or to) each contact pin on interface contactor 204. Further, the mapping identifies possible probe contact test points, along the derived signal paths, by processing the paths in a direction from each contactor contact pin to a point along the path that the mapping determines is a termination point or end of path (EOP) for each mapped path. A mapped path also may include associated elements that are not themselves valid test points, but that are revealed from processing the step 502 descriptor data. For example, a path in a direction away from the contactor contact pin may include a relay. For such a relay, a first sub-path can be traced into the relay and then onward as the continuation of current passage through the relay. Also for the relay, however, a second sub-path can be traced into the relay, but that terminates with the control input of that relay. The control input, however, is not a valid test point because it is not part of the current passage along the path. An example embodiment, therefore, maps the relay control input and may indicate it as a path-terminating EOP, as mapping of the control input may be noteworthy for exhaustively accounting for the detected information or for other purposes. In any event, and as demonstrated below, the step 506 mapping results in a transformed data structure from which an example embodiment later in step 508 identifies favorable spike checking probe test points on test board 202. Each identified test point is along one of the mapped signal paths coupled to a contact pin on interface contactor 204, and preferably a most favorable point on test board 202 is selected per contact pin, thereby reducing the selection to one from among the many possibilities on that board.

Figure 6:
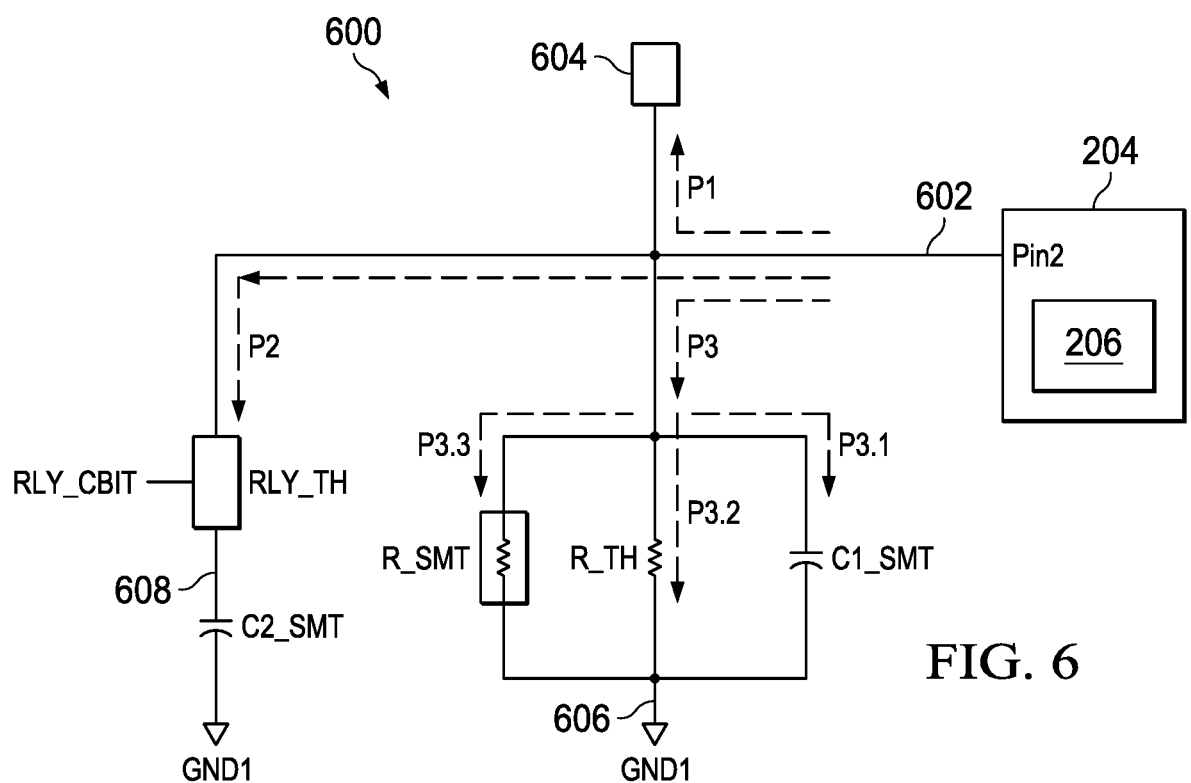
FIG. 6 illustrates a relatively simple circuit configuration with examples of electrical components and connectivity that could exist in a test board and as coupled to a pin (e.g., Pin2) on an interface contactor.

FIG. 6 illustrates a relatively simple circuit configuration 600. Configuration 600 is an example of electrical components and connectivity that could exist in test board 202, as coupled to a conductor surface on test board 202 that is further connected from the conductor surface to a pin (e.g., Pin2) on interface contactor 204. Accordingly, where an IC DUT is positioned within IC socket 206, its Pin2 would be electrically connected to configuration 600, so with an IC DUT so located, many different points along configuration 600 present as possible test points for spike checking. The following describes how, among those test points, an example embodiment maps them into data structures. Additionally, example embodiment methods in connection with more complex structures and other special case components are described later.

From a schematic standpoint, configuration 600 illustrates Pin2 of interface contactor 204 connected to a node 602. Node 602 is connected to a contact pad 604, which may be an intentionally placed test pad or a pogo pin. Node 602 is also connected to a three-parallel device configuration that includes a surface mounted technology (SMT) capacitor C1_SMT, a through-hole resistor R_H, and an SMT resistor R_SMT, each of which are connected between node 602 and a node 606, and node 606 is connected to a ground GND1. Node 602 is also connected to one terminal of a through-hole relay RLY_TH, which is controlled to be opened or closed by a control bit RLY_CBIT, and which has a second terminal connected to a node 608. Node 608 is connected through an SMT capacitor C2_SMT to ground GND1.

FIG. 6 also illustrates various paths of current flow. A first path P1 is shown from Pin2 to node 602 and to contact pad 604, so the path ends, or is deemed per an example embodiment, to have its EOP at contact pad 604. A second path P2 is shown from Pin2 to node 602 and to through hole relay RLY_TH and capacitor C2_SMT to ground GND1, so the path ends, or is deemed per an example embodiment, to have its EOP at ground GND1. A third path P3 is shown from Pin2 to node 602 and to the parallel combination of an SMT capacitor C1_SMT, a through hole resistor R_TH, and an SMT resistor R_SMT. Also for convention, path P3 diverges into three additional paths as it alternatively traverses through each of three alternative paths, each through a respective one of the parallel components, thereby providing a first path P3.1 through capacitor C1 to ground GND1, a second path P3.2 through resistor R_TH to ground GND1, and a third path P3.3 through resistor R_SMT, so the EOP for each of these paths is ground GND1.

Figures 7, 8, 9, 10:
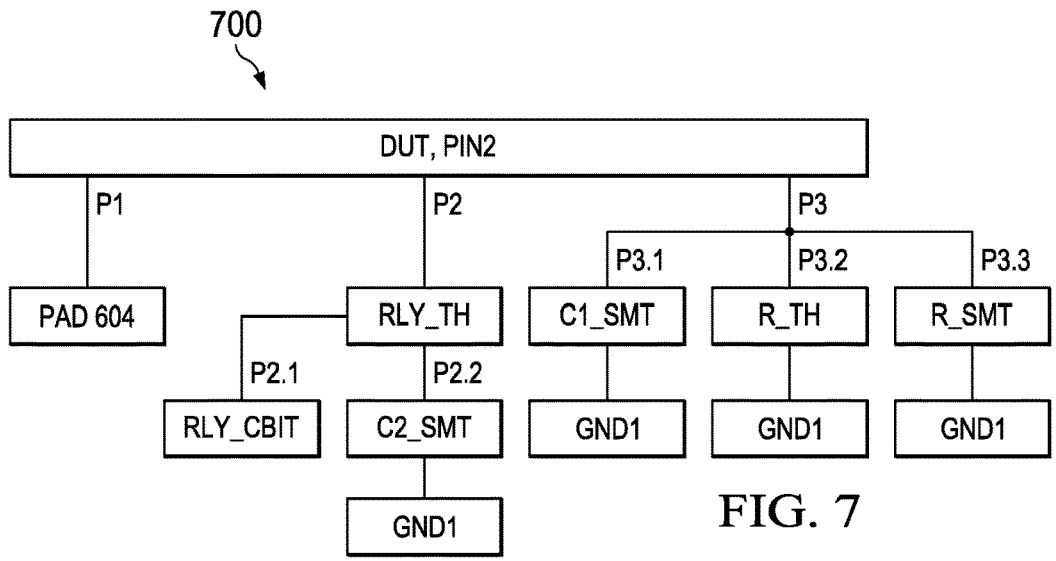
FIG. 7 illustrates a graphical representation of alternative paths from a pin on an interface contactor, with each path including possible test points.
FIG. 8 illustrates an example embodiment data structure path matrix that correlates to the paths shown schematically in FIG. 6 and graphically in FIG. 7.
FIG. 9 illustrates an example embodiment favorability weighting matrix correlating to the paths shown schematically in FIG. 6 and graphically in FIG. 7.
FIG. 10 illustrates a lookup table that the FIG. 1 system may create, store, update, and access for assigning favorability weights to test points in paths.

Given the preceding, the mapping of step 504 produces a map in a data structure form, so as to identify the paths connected to each contactor interface 204 pin. FIG. 7 illustrates a graphical representation 700 of such a characterization, for purposes of also illustrating an example embodiment data structure. In FIG. 7, contactor Pin2 is shown at the top of the Figure, and from below Pin2 is shown a graphical representation line for each respective path to its EOP. The first row below Pin2 shows all components connected directly to Pin2. Beneath that first row is the continuation of each path, which may be referred to as a sub-path, once the current passes through the first component encountered relative to Pin2. Additionally, as mentioned above an example embodiment also includes as a control bit CBIT for some or all relays in the mapped circuit, so FIG. 7 also illustrates an example of such a bit for relay RLY_TH, where the control bit is shown as RLY_CBIT in a sub-path 2.1. Because control bit CBIT is merely a control bit and not in the actual current passage flow, then as introduced earlier an example embodiment identifies the control bit as an EOP and thusly terminates the path in the map data structure. Alternatively, however, where current can continue through relay RLY_TH, a different sub-path P2.2 is shown that continues through capacitor C2_SMT and has an EOP at ground GND1. In the entirety of FIG. 7, therefore, each box (other than any relay control bit) illustrates a possible probe test point, whereby probing any such point will provide a conductive path back to Pin2, enabling a possible analysis (e.g., spike check) the signal at Pin2 during testing.

FIG. 8 illustrates an example embodiment data structure path matrix 800 that correlates to the paths shown schematically in FIG. 6 and graphically in FIG. 7. Path matrix 800 is an example of how computing system 102 transforms the step 502 input data to an alternative computer-usable form for later processing, including for a subsequent identification of a favorable probe test point along a path. Specifically, path matrix data 800 is populated with a number of M rows, for example equal to all total paths electrically coupled to a pin of interface contactor 204. In the examples of FIGS. 6 and 7, therefore, there are M=6 paths from Pin2; accordingly, the FIG. 8 path matrix 800 includes M=6 rows. Further, each row includes a same number N of entries, where each non-null entry is a potential test point along or associated with the path, and the entries are sequenced in an order corresponding to the current path direction starting from the contactor pin and in sequential order away from that pin. For example, the last row of matrix 800 corresponds to path P3.3 of FIG. 7, so the row includes, from Pin2 and for path P3.3, a first row entry of the first potential test point encountered in the path as resistor R_SMT. Continuing in that row and after resistor R_SMT, a second row entry of the second potential test point is ground GND1. Also, for sake of processing, each row has a same number N of entries, with that number equal to the largest number of possible test points in any path coupled to the particular pin. For example, in FIG. 7 path P2 demonstrates that the largest number of potential test points along a path that electrically communicates with Pin2 is N=3. Accordingly, all rows of path matrix 800 have N=3 entries, where for any path (and its corresponding row in the matrix) that has less than N elements (e.g., N=3), a null value of "None" is indicated for any entry beyond the last possible test point in that path. Accordingly, path matrix 800 presents a manner of how an example embodiment maps available input data, that characterizes possible test points on test board 202, into a form for further path analyses.

Step 504 also contemplates that a path may include a test board IC that is attached to test board 202 to assist with testing of a DUT (e.g., during spike checking). Example ICs may include multi-channel transceivers and multi-channel op amps. Such types of devices, when represented in descriptor data of the type input during step 502, are not likely to include pin-to-pin path definitions. Accordingly, step 504 further contemplates test ICs as potential path encountered devices, recognizing however that once a first pin on such a test IC is encountered by a signal traversing such a path, the step 502 input data will not explicitly identify which other pin on the test IC corresponds to the signal as it continues on its path beyond the test IC. In a simple example, if a test IC has multiple input pins and multiple output pins (e.g., from multiple channels), then a path that includes one of the test IC input pins will not be expressly indicated in the step 502 input as having a corresponding output pin to follow the signal from input to respective output on the test IC. Accordingly, step 504 consults available information pertaining to the test IC, including for example IC pin names and pin functions, as well as an IC identifier, if any or all of these are provided from step 502. Further, computational system 100 may include, or be provided access to, additional tabled information (e.g., a database) from which identifying information in step 502 is used as an index or reference to the table(s) so as to further predict a signal path from one pin to another in the test IC. Such information is accessed and processed in step 504 to map a continuing path into the appropriate row of path matrix 800. In all events, with or without encountering such a test IC or other components described above, after mapping step 504, method 500 continues from step 504 to step 506.

In step 506, computational system 100 identifies relative spike checking favorability among the test points mapped in step 504. An example embodiment facilitates this part of the test point identification by either adding to path matrix 800 (FIG. 8) or creating a corresponding favorability weighting matrix 900, as shown by way of example in FIG. 9. Specifically, weighting matrix 900 also correlates to the paths shown schematically in FIG. 6 and graphically in FIG. 7, and further to path matrix 800 of FIG. 8. Weighting matrix 900 is populated with the same number N of rows, each row having the same number of M entries as path matrix 800. Each respective row in both matrices corresponds to a same path, so for example the top row in both matrices 800 and 900 corresponds to path P1. Also, within each respective row, each entry corresponds to a same identified potential test point, where path matrix 800 identifies the test point element, and as now described, weighting matrix 900 provides a favorability weight value (e.g., integer) for the element. By example, a lower (non-negative) weight assigned to a matrix element designates a greater favorability that the low-weighted element is a potential better choice as the finally identified test point for the path corresponding to the matrix. For example, in the first row of weighted matrix 900, the first element is weighted with a '0', the lowest possible weighting, indicating a high favorability as that element to be identified as a test point for Pin2. In contrast, in the last row of weighted matrix 900, the first element is weighted with a '9', a relatively high (or possibly the highest) weighting, indicating a low favorability as that element to be identified as a test point for Pin2.

Assignments of weights in weighting matrix 900 according to an example embodiment method of computational system 100 is now described. Given the step 504 mapping information (e.g., path matrix 800), computational system 100 assigns a weight to each possible test point listed in, or associated with (e.g., CBIT), a path. FIG. 10 illustrates a lookup table (LUT) 1000, which computational system 100 may create, store, update, and access for assigning such weights. LUT 1000 may be stored in various computational system resources, such as in memory (e.g., FIG. 1, system memory 112; database 118) or generated by conditional statements during program execution. The structure, for example, represents IF-THEN type conditions, that is, if a path component is a certain device or device type, then it is assigned a weight attributed to that device or device type. LUT 1000 illustrates example weightings, based on such device/device type. For example, if a path component is a pad, it is assigned the most favorable weight of 0. Accordingly, as computational system 100 processes a path matrix 800 and encounters a pad, then the corresponding matrix position in weighing matrix 900 is filled with a 0 (see, e.g., FIG. 9, first row, first element, corresponding to pad 604 in FIG. 6). As another example, if a path component is a through hole device, meaning the device has a terminal(s) that connects to test board 202 by way of a through-hole, then as computational system 100 processes a path matrix 800 and encounters a through hole device, the corresponding matrix position in weighing matrix 900 is filled with a 1 (see, e.g., FIG. 9, second row, first element, corresponding to relay RLY_TH in FIG. 6). Other examples should now be understandable given the preceding.

LUT 1000 also reserves certain weightings, shown by example as values 2 through 6. Note that values 2 through 6 are positioned between the extremes of most favorable (weight of 0) to least favorable (weight of 9). These reserved values provide potential additional granularity between the favorability extremes and also permit additional consideration as computational system 100 processes more data, such as to anticipate and overcome future challenges, for example in mapping more complicated test board designs. Additionally or alternatively with respect to such reserved values, in an example embodiment computational system 100 receives feedback from spike checking as such tests accrue, either directly from the system or from user input. For example, as test engineers implement and exercise computational system 100 for spike checking, use of the transformed output test point indications may produce results from which additional anecdotal or statistical observations may be made, such as to the propriety and efficacy of test points that are identified by computational system 100 and then probed. With such historic data, weights in LUT 1000 may be adjusted, and additional devices/device types may be added, either through user feedback of inclusion of artificial intelligence to perform machine learning or the like added to, or augmenting, computational system 100. Accordingly, ultimately the weights in LUT 1000 are assigned to either take or avert risks based on statistical analyses of previous risks and results. Further, as computational system 100 processes additional paths, it will gain a more thorough and vetted data set from which it can process not only patterns it has encountered, but can apply findings (e.g., paths, weightings, and final probe test point identification) from those patterns to similar patterns for the same or other test boards in the future. In addition, once ATE test programs are later used on a larger scale with probers/wafers or final test singulated devices, feedback from such testing also may augment weight assignments in LUT 1000. Such changes may include favorability weights between and including 2-6, and of course also could be used to alter other weights or add still additional granularity to such weights.

The weights stored by computational system 100 in LUT 1000 are selected based on desirability or favorability of a potential test point for probing, and computational system 100 bases those weights by factors relating to the device. As noted above, lower weighting is assigned to more favorable possible test points, and the examples in LUT 1000 indicate relative favorability programmed into, or derived by, computational system 100. For example, often a pad on test board 202 will be an intentionally located probe position, which may be among thousands of potential test points. An example embodiment deems such a component a highly favorable potential test point and assigns it the most favorable weighting of 0, given the intentional location and likely accessibility of a test pad. Further, an example embodiment deems a next highest favorability weight to some or all through hole devices, as each terminal of such a device is likely to be readily reachable by a probe, for example at the solder ball or other connection at which the through hole terminal is electrically and physically connected. Toward the less favorable weightings, an example embodiment deems an SMT device a relatively unfavorable weighting, where SMT relays are deemed a rating of 7 and other SMT devices a rating of 9, for example because connections of SMT devices to test board 202 tend to be more difficult, if not impossible, to reach with a physical probe in a safe and non-destructive manner. An example embodiment also deems ground connections as relatively unfavorable (weighting of 8), and certain others devices or contact points also may be unfavorable as possible test points and hence also weighted 9. Such other contact points can include a control bit CBIT of a relay, for example, where in the case of such a control bit, it is undesirable (or unusable) as a test point because the node current in and out of the relay does not path to the control bit.

Returning to FIG. 5, after step 506 determines relative favorability, in step 508, computational system 100 identifies a particular test point as favorable for spike checking, so that the identified test point can be used in step 510, for example, by either a test engineer or to direct EPA 120 to position its probe to the identified test point. In an example embodiment, for each pin on contactor 204 to be tested, computational system 100 performs step 508 by searching weighting matrix 900 for the row starting with the lowest weighting, and then generally the test point corresponding to that lowest weighting is identified as the favorable test point for probing. Additional rules may be enforced as part of step 508, which take into account other considerations for identifying the test point for probing, as further discussed below.

Spatial constraints are an example of an alternative factor for step 508, for example excluding a test point(s) as a candidate for favorable selection/identification, if the test point(s) is within a certain proximity to contactor 204. For such possible test points, if method 500 is used in conjunction with EPA 120, then it may not be possible for the collectively apparatus of probe 210 to get within a minimum distance of contactor 204 or other items associated with test board 202, based on mapped data in any one or more of the x-, y-, and z-dimension data that is provided. Accordingly, an example embodiment may set a minimum prohibition radius or other area surrounding or adjacent part or all of contactor 204 as a probe-prohibiting area in which probing is prohibited. Accordingly, in step 510, even if a potential test point has a desirable weight (e.g., 0), that favorability can be overridden and the test point not identified or excluded as the selected test point to be probed, if other information regarding the test point indicates it is in the probe-prohibited area. Alternatively, any such test point can be given a high (e.g., 9) unfavorability weighting in step 506.

Rows in weighting matrix 900 starting with equally weighted components also present another consideration for the step 508 determination. If, for example, two (or more) rows in weighting matrix 900 start with a same lowest favorable weight, then step 508 identifies as the desired probing test point, among the multiple low-rated possible test points in the respective multiple rows, as that test point in closest proximity to contactor 204, or closest to but beyond any probe-prohibiting area, if such a prohibition area is defined. Or, if all rows have a first element with a same weighting, then the selected row may be the row that has the lowest weighted element either anywhere else in the row, or closest to the first element in the row, where the test point corresponding to that element is identified by step 508 as the identified probing test point.

Rows in path matrix 800, or weighting matrix 900, that correspond to a relay also may pose special processing by step 508. For these cases, step 508 contemplates the possibility that the relay could be open (CBIT not enabled) during spike checking, in which case probing at a point in the path that includes the relay, at an electrical conductivity position beyond the relay relative to contactor 204, would not detect the signal on the contactor-side of the relay. Accordingly, step 508 may exclude from identification any test point in the path, including precluding it as a candidate, that is farther in the electrical path from the contactor than such a relay. Or, in this instance, any test point beyond the relay in the row may be assigned an unfavorably high weight in step 506. Or still further, step 508 can identify such a component as the desired test point, but also while providing an indication (or control signal) that requires that the relay in the path be controlled to be closed (CBIT enabled) during the time the identified test point is probed for spike checking.

Rows in path matrix 800, or weighting matrix 900, that correspond to a shared instrument also may be excluded from 508 as a candidate for identification as the favored test point, unless there is no other candidate. Specifically, a shared instrument is some type of instrument on test board 202 that is connected to more than one site on test board 202, that is, it is operable to concurrently test multiple ICs (e.g., in multiple respective contactors). An example embodiment contemplates, therefore, that such a possible test point, if probed during spike checking, may be affected by signaling from a DUT other than the one intended to be examined during the checking. Accordingly, such a candidate test point may be excluded from step 508, or assigned a high unfavorability weighting in step 504.

Figure 11A:
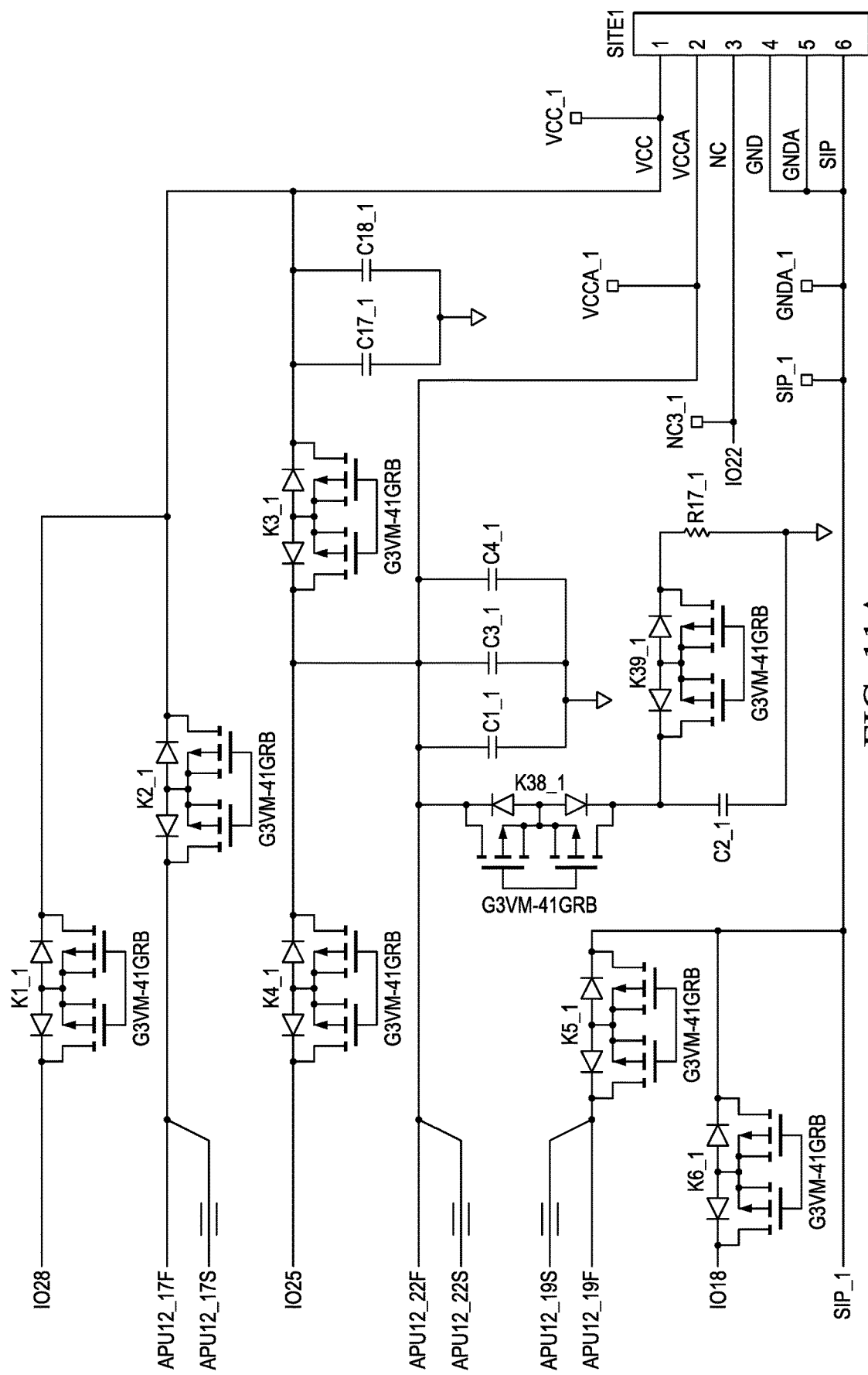
FIG. 11A illustrates a more complex circuit configuration, and FIG. 11B includes that configuration with arrows for possible paths, with examples of electrical components and connectivity that could exist in a test board and as coupled to a contactor pin.

FIG. 11A illustrates an excerpt of a more complicated circuit configuration 1100, for example as compared to the relatively simple circuit configuration 600. Circuit configuration 1100 again shows the same general possibilities of alternative paths from a Pin2 of a particular contactor site. FIG. 11A also indicates certain device and pin naming conventions that are more typical of the type of data that may be received in step 502. Further, FIG. 11B repeats the illustration of circuit configuration 1100, but adds arrows to depict various alternative current paths along which potential test points are encountered, in the direction away from Pin2. With this example, note that one path leaving from a first Pin2, upward in the directional sense of the illustration, reaches (and terminates) at a second pin (Pin1) on the contactor 204. When step 504 (FIG. 5) maps such a path starting from a first contactor pin and that so reaches a second contactor pin, that second pin is mapped as an EOP and then step 506 weights that second pin as a relatively unfavorable (e.g., weight of nine) test point, as the second pin (e.g., Pin1) could well include signal impact differing from the first pin (e.g., Pin2) in the mapped path. Indeed, such an unfavorable weighting also may be assigned by step 506 to any other path directly connected to the second contactor pin.

Figure 11B:
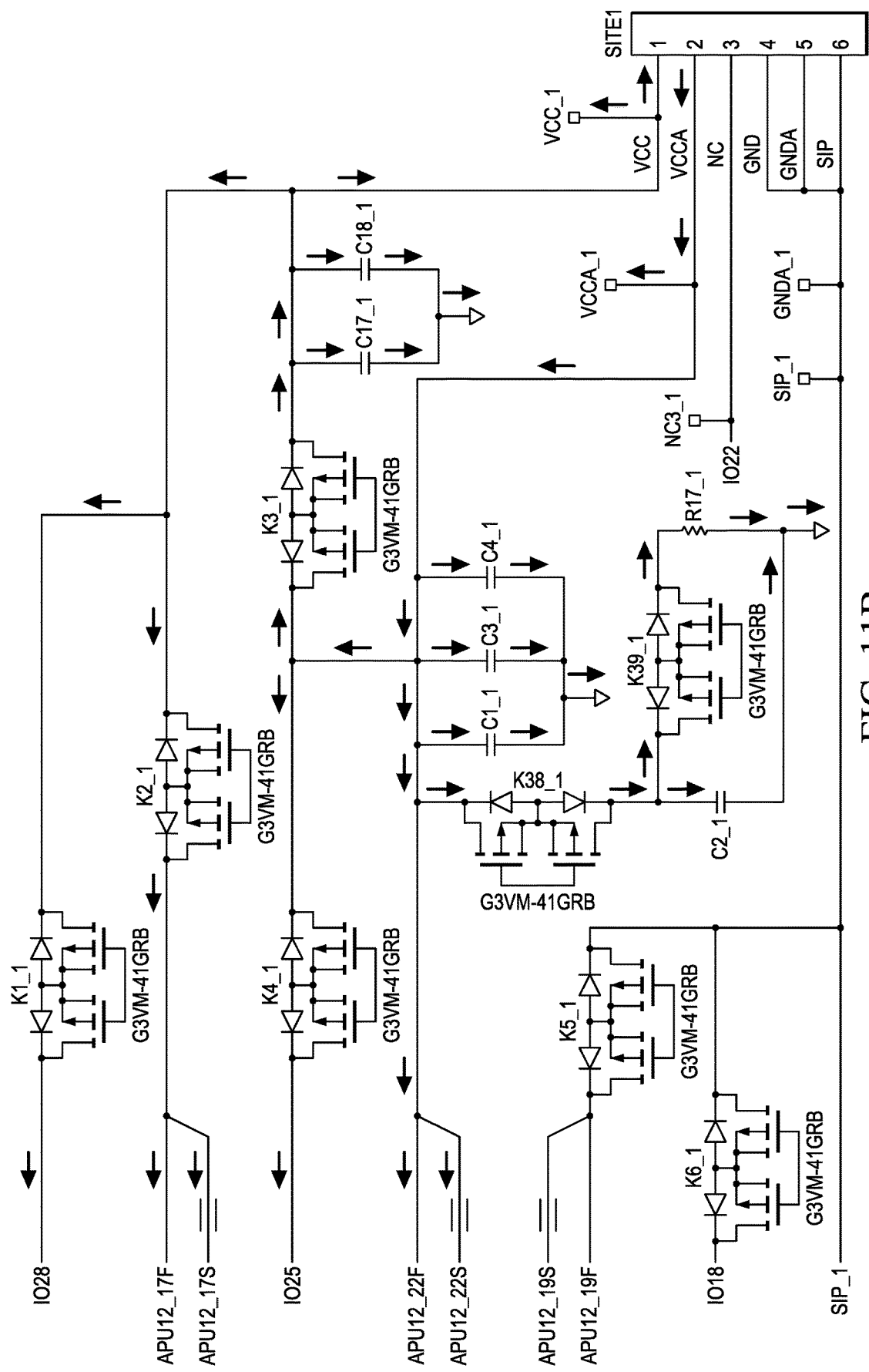

FIG. 12 illustrates a path matrix 1200, and FIG. 13 illustrates a weighting matrix 1300, for the paths from Pin2 in circuit configuration 1100 of FIGS. 11A-11B. Given the relatively increased complexity of circuit configuration 1100, method 500 produces a larger number of M rows in matrices 1200 and 1300, and the longest path has a total of N=6 possible test points. Accordingly, each row has N=6 entries, with null values (indicated as "None") for paths that include less than N=6 included or associated test points. Further, weighting matrix 1300 indicates three equally weighted favorable rows, as its final three rows all start with the highest favorability rating of 0. As described earlier, therefore, in an example embodiment step 508 identifies the test point corresponding to the first entry from among those three rows, for example with respect to the entry in one of the rows corresponding to a test point that is closest to, but outside of any probe-prohibition area, of contactor 204.

From the above, one skilled in the art should appreciate that example embodiments include an electromechanical apparatus for positioning a probe tip, or differential probe tips, on selected test points on an IC test board and programing and data sets for mapping test board information to control and refine the selection of test points. Other example embodiments include a programmed system for identifying a favorable spike check probing test point among test board contacts, by receiving test board data in one form and transforming it to another form, from which the system also identifies from the transformed form the favorable probing test point. The identified favorable test point may be used for spike check probing of the test board, including by the above-noted electromechanical apparatus. Example embodiments have been described with various options and alternatives, as well as various benefits. These and others will be appreciated or ascertainable by one skilled in the art, in view of the teachings of this document. Accordingly, additional modifications are possible in the described embodiments, and other embodiments are possible, within the scope of the following claims.

What is claimed is:

1. A nontransitory computer-readable program storage medium having stored thereon program instructions that when executed by a processor have the processor capable of:
receiving a set of input data, the input data comprising test board attributes, the attributes comprising identification of devices coupled to the test board, the test board further comprising a plurality of conductive surfaces, each conductive surface in the plurality of conductive surfaces for electrical communication with a respective pin of a plurality of pins of a device under test;
transforming the set of input data into test board mapping data, the test board mapping data comprising, for each conductive surface for electrical communication with a respective pin of the plurality of pins, an ordered listing of potential test points along a path that couples to the conductive surface, wherein the potential test points are derived from at least one of the test board attributes; and
identifying, for each of the conductive surfaces coupled for electrical communication with a respective pin of the plurality of pins, a selected test point from among the one or more potential test points, the selected test point for spike check probing of the device under test.

2. The nontransitory computer-readable program storage medium of claim 1, wherein the identifying comprises identifying a node of a device for spike check probing.

3. The nontransitory computer-readable program storage medium of claim 1, wherein the identifying comprises assigning a weight, from a range of favorable to unfavorable as a spike check test point, to respective test board attributes in the path.

4. The nontransitory computer-readable program storage medium of claim 3, wherein the identifying comprises identifying the selected test point in response to a most favorable weight.

5. The nontransitory computer-readable program storage medium of claim 3, wherein the most favorable weight is assigned to a test point comprising a test pad on the test board.

6. The nontransitory computer-readable program storage medium of claim 3, wherein the assigning assigns a more favorable weight to a test point comprising a through hole device than a test point comprising a surface mounted technology device.

7. The nontransitory computer-readable program storage medium of claim 3, wherein the assigning assigns a less favorable weight to a test point comprising a ground than a test point comprising a through hole device.

8. The nontransitory computer-readable program storage medium of claim 1:
wherein the attributes comprise spatial indication of at least some of the devices; and
wherein the identifying comprises identifying a node of a device for spike check probing in response to proximity of a device to a respective one of the conductive surfaces.

9. The nontransitory computer-readable program storage medium of claim 1:
wherein the attributes comprise spatial indication of at least some of the devices; and
wherein the identifying comprises identifying a node of a device for spike check probing in response to proximity of a device to, but beyond a probe-prohibited area adjacent, a respective one of the conductive surfaces.

10. The nontransitory computer-readable program storage medium of claim 1 wherein the attributes further comprise any of device number, device height, and location of the device on the test board.

11. The nontransitory computer-readable program storage medium of claim 10 wherein the identifying is responsive to at least one of the device number, device height, and location of the device on the test board.

12. A nontransitory computer-readable program storage medium having stored thereon program instructions that when executed by a processor have the processor capable of:
receiving a set of input data, the input data comprising test board attributes, the attributes comprising identification of devices coupled to the test board, the test board further comprising a plurality of conductive surfaces, each conductive surface in the plurality of conductive surfaces for electrical communication with a respective pin of a plurality of pins of a device under test;
transforming the set of input data into test board mapping data, the test board mapping data comprising, for each conductive surface for electrical communication with a respective pin of the plurality of pins, an ordered listing of potential test points along a path that couples to the conductive surface, wherein the potential test points are derived from at least one of the test board attributes;
identifying, for each of the conductive surfaces coupled for electrical communication with a respective pin of the plurality of pins, a selected test point from among the one or more potential test points, the selected test point for spike check probing of the device under test
wherein the transforming transforms the set of input data into test board mapping data comprising whether a path comprises a relay with an associated relay control bit; and
wherein the identifying comprises excluding identification of the relay control bit as the selected test point.

13. A nontransitory computer-readable program storage medium having stored thereon program instructions that when executed by a processor have the processor capable of:
receiving a set of input data, the input data comprising test board attributes, the attributes comprising identification of devices coupled to the test board, the test board further comprising a plurality of conductive surfaces, each conductive surface in the plurality of conductive surfaces for electrical communication with a respective pin of a plurality of pins of a device under test;

transforming the set of input data into test board mapping data, the test board mapping data comprising, for each conductive surface for electrical communication with a respective pin of the plurality of pins, an ordered listing of potential test points along a path that couples to the conductive surface, wherein the potential test points are derived from at least one of the test board attributes;

identifying, for each of the conductive surfaces coupled for electrical communication with a respective pin of the plurality of pins, a selected test point from among the one or more potential test points, the selected test point for spike check probing of the device under test wherein the transforming transforms the set of input data into test board mapping data comprising whether a device is a shared instrument on the test board for concurrently testing multiple devices under test; and wherein the identifying comprises excluding identification of the shared instrument as the selected test point.

14. A nontransitory computer-readable program storage medium having stored thereon program instructions that when executed by a processor have the processor capable of:

receiving a set of input data, the input data comprising test board attributes, the attributes comprising identification of devices coupled to the test board, the test board further comprising a plurality of conductive surfaces, each conductive surface in the plurality of conductive surfaces for electrical communication with a respective pin of a plurality of pins of a device under test;

transforming the set of input data into test board mapping data, the test board mapping data comprising, for each conductive surface for electrical communication with a respective pin of the plurality of pins, an ordered listing of potential test points along a path that couples to the conductive surface, wherein the potential test points are derived from at least one of the test board attributes; and identifying, for each of the conductive surfaces coupled for electrical communication with a respective pin of the plurality of pins, a selected test point from among the one or more potential test points, the selected test point for spike check probing of the device under test wherein the identification of devices comprises identification of an integrated circuit; and wherein the transforming comprises a transform of the identification of the integrated circuit into an ordered listing of potential test points from a first pin of the integrated circuit to a second pin of the integrated circuit.

15. A method of operating a system comprising a processor, the method comprising:

receiving a set of input data, the input data comprising test board attributes, the attributes comprising identification of devices coupled to the test board, the test board further comprising a plurality of conductive surfaces, each conductive surface in the plurality of conductive surfaces for electrical communication with a respective pin of a plurality of pins of a device under test;

transforming the set of input data into test board mapping data, the test board mapping data comprising, for each conductive surface for electrical communication with a respective pin of the plurality of pins, an ordered listing of potential test points along a path that couples to the conductive surface, wherein the potential test points are derived from at least one of the test board attributes; and identifying, for each of the conductive surfaces coupled for electrical communication with a respective pin of the plurality of pins, a selected test point from among the one or more potential test points, the selected test point for spike check probing of the device under test.

16. The method of claim 15, wherein the identifying step comprises identifying a node of a device for spike check probing.

17. The method of claim 15, wherein the identifying step comprises assigning a weight, from a range of favorable to unfavorable as a spike check test point, to respective test board attributes in the path.

18. The method of claim 17, wherein the assigning step assigns a most favorable weight to a test point comprising a test pad on the test board.

19. The method of claim 17, wherein the assigning step assigns a more favorable weight to a test point comprising a through hole device than a test point comprising a surface mounted technology device.

20. The method of claim 17, wherein the assigning step assigns a less favorable weight to a test point comprising a ground than a test point comprising a through hole device.

21. The method of claim 15:
wherein the attributes comprise spatial indication of at least some of the devices; and
wherein the identifying comprises identifying a node of a device for spike check probing in response to proximity of a device to a respective one of the conductive surfaces.

22. The method of claim 15:
wherein the attributes comprise spatial indication of at least some of the devices; and
wherein the identifying comprises identifying a node of a device for spike check probing in response to proximity of a device to, but beyond a probe-prohibited area adjacent, a respective one of the conductive surfaces.

23. The method of claim 15 wherein the identifying is responsive to at least one of a device number, device height, and location of a device on the test board.

24. The method of claim 15 and further comprising operating a system comprising a processor to control an electromechanically positioned probe to a position corresponding to the selected test point.

25. A method of operating a system comprising a processor, the method comprising:

receiving a set of input data, the input data comprising test board attributes, the attributes comprising identification of devices coupled to the test board, the test board further comprising a plurality of conductive surfaces, each conductive surface in the plurality of conductive surfaces for electrical communication with a respective pin of a plurality of pins of a device under test;

transforming the set of input data into test board mapping data, the test board mapping data comprising, for each conductive surface for electrical communication with a respective pin of the plurality of pins, an ordered listing of potential test points along a path that couples to the conductive surface, wherein the potential test points are derived from at least one of the test board attributes; and identifying, for each of the conductive surfaces coupled for electrical communication with a respective pin of the plurality of pins, a selected test point from among the one or more potential test points, the selected test point for spike check probing of the device under test wherein the identifying comprises identifying an integrated circuit; and wherein the transforming comprises transforming the identification of the integrated circuit into an ordered listing of potential test points from a first pin of the integrated circuit to a second pin of the integrated circuit.

* * * * *